United States Patent [19]
Karlicek, Jr.

[11] Patent Number: 5,153,147
[45] Date of Patent: Oct. 6, 1992

[54] SELECTIVE GROWTH OF InP IN DEVICE FABRICATION

[75] Inventor: Robert F. Karlicek, Jr., South Plainfield, N.J.

[73] Assignee: AT&T Bell Laboratories, Murray Hill, N.J.

[21] Appl. No.: 661,743

[22] Filed: Feb. 27, 1991

[51] Int. Cl.⁵ .............................................. H01L 7/36
[52] U.S. Cl. .................................... 437/107; 437/88; 437/108; 148/DIG. 65; 156/610; 156/613; 156/614; 156/DIG. 70
[58] Field of Search ....... 156/610, 613, 614, DIG. 70; 437/88, 107, 108; 148/DIG. 65

[56] References Cited

U.S. PATENT DOCUMENTS

| | | | |
|---|---|---|---|
| 3,218,205 | 11/1965 | Ruehrwein | 156/DIG. 70 |
| 4,010,045 | 3/1977 | Ruehrwein | 156/DIG. 70 |
| 4,716,130 | 12/1987 | Johnston et al. | 437/104 |
| 4,734,387 | 3/1988 | Nelson et al. | 156/613 |
| 4,800,173 | 1/1989 | Kanai et al. | 437/88 |
| 4,904,616 | 2/1990 | Bohling et al. | 437/88 |
| 4,965,222 | 10/1990 | Staring | 437/88 |

FOREIGN PATENT DOCUMENTS 271196  8/1989  German Democratic Rep. .................................. 156/625

OTHER PUBLICATIONS

Abstract "Selective Area Epitaxy on InP Substrates: A Comparison of Growth Behaviour at Low and Atmospheric Pressure", D. Robein et al., IV European Workshop of MOVPE, Nijmeyen, The Netherlands, Jun. 1991.

Kuech et al., *Journal of Crystal Growth*, vol. 99, p. 324 (1990).

Azoulay et al., *Applied Physics Letters*, vol. 58, No. 2, p. 128 (1991).

Miller et al., *Optical Fiber Telecommunications II*, Academic Press, Inc., 1988, pp. 467–630.

Pearsall et al., ed. John Wiley & Sons, 1982, *GaInAsP Alloy Semiconductors*, pp. 11–103.

Stringfellow, *Organometallic Vapor-Phase Epitaxy*, Academic Press, 1989.

Liou et al., *IEEE Journal of Quantum Electrons*, vol. 26, p. 1376 (1990).

Sze, ed., *VLSI Technology*, McGraw Hill Book Co., 1983, Chapter 7.

*Primary Examiner*—Robert Kunemund
*Attorney, Agent, or Firm*—B. S. Schneider

[57] ABSTRACT

Selective epitaxy for indium phosphide in metalorganic chemical vapor deposition is possible by using a specific technique. In particular, a halogenated organic material is introduced with the InP precursors. This halogen-containing material should decompose to release halogen at approximately the same temperature that the metalorganic indium precursor decomposes. Through this process the manufacture of InP-based lasers is significantly enhanced and allows the use of reactive ion etching to form structures upon which InP regrowth is desired.

7 Claims, 1 Drawing Sheet

SELECTIVE GROWTH OF InP IN DEVICE FABRICATION

BACKGROUND OF THE INVENTION

1. Technical Field

The invention relates to semiconductor devices and in particular to devices involving InP.

2. Art Background

Semiconductor laser devices based on InP materials, i.e., materials including both indium and phosphorus, such as InP, indium gallium phosphide and indium gallium arsenide phosphide, are of particular significance in optical communication applications. Such lasers are generally formed by depositing a series of layers including a n-type InP layer, a quaternary alloy region forming the layer, a p-type InP layer and generally a quaternary indium gallium arsenide phosphide overlying layer. These layers are then patterned to form a mesa such as shown in FIG. 1 with the active region denoted as 1, the n and p InP layers denoted 2 and 3, respectively, and the quaternary overlying layer denoted 4. The sides of the mesa are passivated to prevent contamination, to ensure mechanical integrity for subsequent processing, and provide the refractive index difference required for efficient waveguiding in the active layer. However, the materials and structure used are also chosen to ensure the excessive current leakage, i.e., a current greater than 10 $\mu$A, does not flow from the mesa region through the passivation area to the substrate or to another mesa region.

Generally, this isolation is performed by forming in the isolation region, 7 in FIG. 2, a series of reverse-biased p-n junctions and/or semi-insulating regions from appropriately doped InP materials. If such InP materials are directly deposited onto the substrate containing the mesas, unacceptable growth structures such as shown in FIG. 3 are obtained. Such structures are produced since the deposited InP not only grows in the region 7 but also grows on the mesa 8. To avoid such structures, a mask, 9 in FIG. 4, that substantially overhangs the mesa by generally dimensions of approximately 2 $\mu$m, is formed before passivation region growth by undercutting an etching mask layer during mesa formation. The overhang prevents the growth structure shown in FIG. 3 obtained where a mask (not shown) is present over a mesa of the depicted geometry. However, to produce the undercut region, wet etching rather than etching in a plasma is required. Etching in a plasma is preferred since it is generally more easily controlled and generally leads to improved morphology in adjacent regions. Although a selective growth process which allows growth only in passivation areas and not on the mesas would eliminate the need for the overhang structure shown in FIG. 4, selective growth is generally not available for InP, and thus etching in a plasma is precluded.

As discussed, selective growth of InP is desirable for laser production and is also considered useful for applications such as opto-electronic integrated circuit fabrication. Various approaches have been employed for selective growth of GaAs but these approaches are not analogously useful for InP. For example, GaAs in metalorganic chemical vapor deposition (MOCVD) is formed utilizing precursors such as arsine and triethyl gallium. As described by Kuech et al, *Journal of Crystal Growth*, 99, 324 (1990), the use of the corresponding chloride, e.g., diethyl gallium chloride for the source of gallium allows selective growth of GaAs relative to silicon nitride or silicon dioxide.

The analogous reaction to form InP, however, has severe limitations. Diethyl indium chloride has a vapor pressure of less than 1 torr at 50° C. Therefore, to supply sufficient indium precursor, i.e., to supply a flow greater than 0.1 sccm, the diethyl indium chloride must be heated to a temperature substantially above room temperature. To prevent condensation of the resulting flow in the deposition equipment, the entire gas introduction path must be correspondingly heated. This requirement although feasible is generally not practical for commercial applications.

Research into selective deposition of GaAs has also involved the use of chlorine in the arsenic precursor. For example, as described by Azoulay and Dugrand, *Applied Physics Letters*, 58 (2), 128 (1991), arsenic trichloride was employed with trimethyl gallium and $AsH_3$ to produce a selective growth of GaAs on a semiconductor region relative to a masked region. Analogous use of phosphorus trichloride for selective growth of InP is again inconvenient. The phosphorus trichloride is relatively corrosive and requires substantial complication in the construction and operation of the deposition equipment.

Therefore, although a selective approach for the deposition of InP is quite desirable, a suitable method has not been reported.

SUMMARY OF THE INVENTION

Attempts to produce selective growth by the introduction of hydrogen chloride with a phosphorus and an indium precursor for MOCVD does not produce selective growth as might be expected from work involving the use of arsenic trichloride or diethyl gallium chloride for selective growth of GaAs. However, surprisingly, use of an organic halide e.g., chloride in conjunction with a source of phosphorus and source of indium in the deposition of InP through MOCVD allows selective growth on a semiconductor material relative to masked dielectric. (Halide in the context of this invention means an organic entity containing at least one halogen atom.) Essentially complete selectivity is achievable. The process is particularly desirable in conjunction with the formation of passivation regions of semiconductor laser structures and allows the use of etching in a plasma for the formation of the laser active region. Structures such as shown in FIG. 5 (where the reference numerals correspond to the same regions as indicated by identical reference numerals in the other FIGS.) are producible utilizing a plasma etching technique in conjunction with selective InP deposition. The technique does not produce any unacceptable level of carbon impurities and does not hinder doping to produce n-regions, p-regions or semi-insulating regions of InP. Additionally, the morphology of the deposited layer including the region or surface adjacent to the mask edge is substantially improved.

BRIEF DESCRIPTION O THE DRAWING(S)

FIGS. 1-4 are illustrative of configurations obtained in processes involving non-selective growth of InP; and FIG. 5 is illustrative of configurations obtainable by the inventive technique.

DETAILED DESCRIPTION

Figure 1:
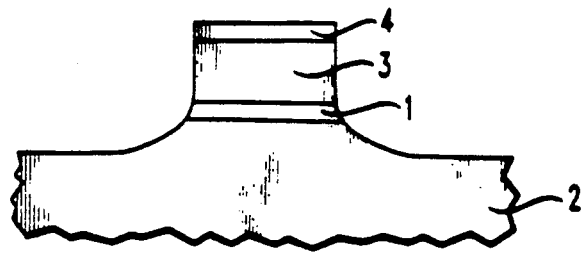
Figure 2:
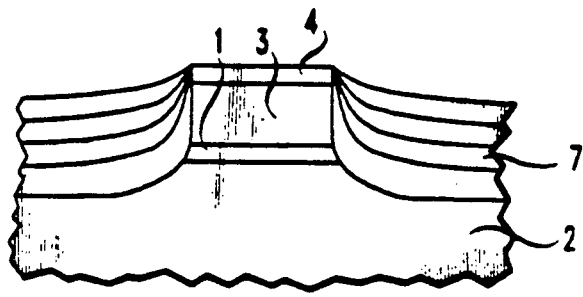
Figure 3:
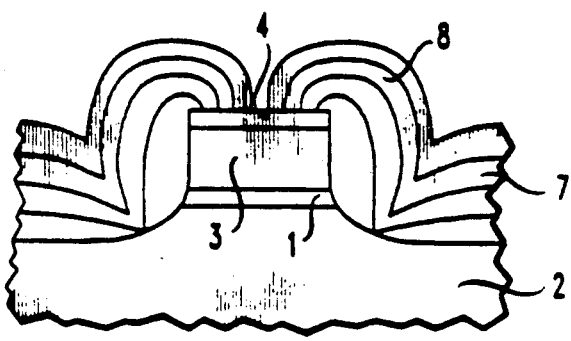
Figure 4:
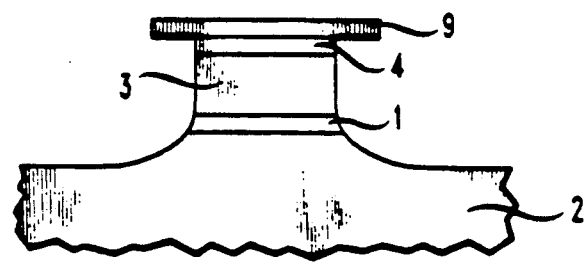
Figure 5:
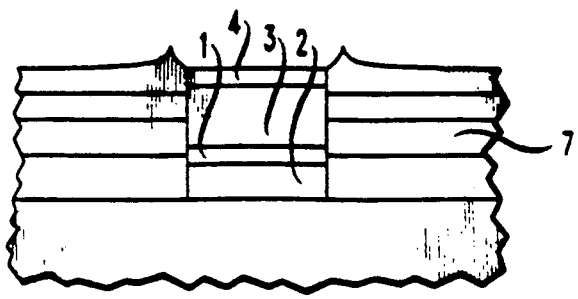

As discussed, the invention involves the formation of a device where one step in that formation uses the selective deposition of InP. (The term InP in this context includes InP with other compositions such as dopants.) Additionally, even for non-selective growth the morphology of the deposited layer is improved and is useful for applications such as planarization. However, for pedagogic purposes, the invention will be described in terms of selective growth. Suitable devices in which this process is employed include lasers, LEDs, detectors, transistors. Descriptions of the formation of such devices are found in *Optical Fiber Telecommunications II*, S. E. Miller and I. P. Kaminow, eds, Academic Press, Inc., 1988, pp. 467–630. For example, in the case of a laser device a n-InP substrate is employed; a quaternary alloy of indium gallium arsenide phosphide is deposited as disclosed in "GaInAsP Alloy Semiconductors," pp. 11-103, T. P. Pearsall, ed., *John Wiley & Sons*, 1982; InP is deposited as described in Pearsall, supra; and a second layer of indium gallium arsenide phosphide is deposited. A masking material such as $SiO_2$ or $Si_xN_y$ is then deposited and photolithographically defined to form stripes that typically are approximately 1 μm wide. The structure is then reactive ion etched (RIE) utilizing a hydrocarbon-based etchant gas with plasma frequencies in the range 100 kHz to 14 MHz, power in the range 0.2 to 0.8 $w/cm^2$ and gas pressures in the range 5 to 100 mTorr. The selective epitaxy is then performed on this structure. Similar device sequences are used in applications such as optoelectronic integrated circuits where the steps other than selective epitaxy are described in "Y Junction Power Divider in InGaAsP-Indium Phosphide Photonic Integrated Circuits," K-Y Liou et al, *IEEE Journal of Quantum Electrons*, Vol. 26, p. 1376 (1990).

The epitaxy, e.g., selective epitaxy, of the invention is performed utilizing a precursor for indium, a precursor for phosphorus, a dopant precursor (if desired) and an organic halide, e.g., chloride, distinct from the indium precursor. Suitable precursors for the deposition of indium have been extensively described in articles such as *Organometallic Vapor-Phase Epitaxy*, G. B. Stringfellow, Academic Press, 1989. The particular precursor gases used are not critical. Typically, indium alkyls such as trimethyl indium and triethyl indium where the alkyl preferably has 1-6 carbon atoms in conjunction with a source of phosphorus, e.g., phosphine, produce InP of satisfactory quality. The halide should decompose at the reaction temperature to produce an halogen containing entity reactive with indium. Halides including bromides, chlorides, and iodides are useful. However flourides are generally excessively reactive and typically should be avoided.

The dopant employed depends on whether a p, n, or semi-insulating layer, is desired. A full description of suitable precursors for semi-insulating layers is found in U.S. Pat. No. 4,716,130 dated Dec. 29, 1987, which is hereby incorporated by reference. Suitable dopants for p- and n-type materials are described in Stringfellow, supra.

As discussed, the organic halide (i.e., an organic compound containing at least one halogen atom) is chosen so that it decomposes releasing reactive halogen containing atoms or molecules at a temperature within 100° C. of the decomposition temperature for the source of indium. Typical organic halides suitable for this purpose are alkyl halides such as trichloroethane for sources of indium such as trimethyl or triethyl indium.

The concentration of the halide relative to the source of indium is generally chosen to be in the range 0.05/1 to 1/1. The precise amount necessary to allow selective deposition depends on the type and concentration of the particular precursor gases, growth temperatures, reactor pressures, and reactor design employed. A control sample is easily used to determine the precise ratio required for a specific degree of selectivity. (The degree of selectivity is defined as the percentage area of the mask covered by unwanted deposits. Typically it is desirable that no more than 10 percent is covered in no more than 50 percent of the mesa masks on a wafer. Mask as used in this context refers generically to the region where deposition is not required.) The absence of essentially all growth on the mask or over the top of the mask edge is achievable with the invention.

The organic chloride is generally introduced into the precursor gas flow by conventional reagent handling systems. If the organic chloride is a liquid, generally a bubbler heated to an appropriate temperature and subjected to a carrier gas flow yields suitable results. Typical for carrier gases such as $H_2$ carrier gas bubbler temperatures in the range of −20° C. to 20° C. yield suitable organic chloride concentration i.e., gas concentrations in the range 0.01 to 0.15 atm. Dilution with additional $H_2$ gas downstream of the bubbler is useful to reduce the organic chloride concentration to a desired value, typically in the range of $10^{-6}$ atm to $10^{-3}$ atm. If the organic halide is a gas, direct introduction into the process flow is advantageously employed. It is desirable in the case of a liquid that the carrier gas be relatively pure so that impurities are not introduced into the deposited InP. Generally, sufficient carrier gas is flowed through the bubbler to produce a saturated composition of carrier gas and organic chloride. (The flow need not necessarily be saturated but greater control is achieved by employing this expedient.)

The selective deposition of InP depends on the particular materials upon which growth is desired as compared to those where growth should be avoided. Generally, selectivity better than $10^{-4}$ percent is achieved by deposition on semiconductor materials such as InP relative to materials such as $SiO_2$ where growth is not desired.

The following examples are illustrative of conditions suitable in the use of the inventive process.

EXAMPLE 1

A standard laser structure consisting of an n-InP substrate, a 0.5 μm n-InP buffer layer, 0.1 μm InGaAsP quaternary alloy layer, 0.8 μm p-InP cladding layer, and a 0.05 μm InGaAsP quaternary alloy cap layer was coated with 3000 Å of $SiO_2$ and a 1.5 μm thick layer of Microposit 1450 positive photoresist. (These layers were deposited as described in *VLSI Technology*, S. M. Sze, ed., McGraw Hill Book Co., 1983, Chap. 7.) Stripes 2 μm wide and 508 μm apart were formed in the photoresist photolithographically u sing a dose of 100 mJ at 405 nm and were used to pattern the $SiO_2$. Etching to form the pattern was performed in a $CF_4/O_2$ (8% $O_2$) plasma at an rf power of 300 W, using a flow rate of 100 sccm, pressure of 300 mtorr and a DC bias of −80 V. The patterned sample was then in turn etched in a standard parallel plate RIE reactor to form mesas in the laser structure 1.5 μm wide and 3.5 μm tall. The conditions for this etch were 100 sccm of 10% $CH_4/H_2$, pressure of 50 mtorr, power of 250 W and a DC bias of −340 V. The sample was then cleaned in an $O_2$ plasma, followed by a 2 minute dip in sulfuric acid and a 5 minute rinse in de-ionized water.

The sample was then loaded into a commercial (Aixtron) low pressure MOCVD reactor. The reactor was operated at a pressure of 20 mbar and a temperature of 640° C. The total reactor flow rate was 7.5 SLPM and the flow rate of $PH_3$ was 200 sccm. The trimethyl indium (TMI) was introduced by flowing $H_2$ at the rate of 330 sccm through the TMI at a temperature of 17° C. The trichloroethane (TCE) was maintained at a temperature of −10° C. and $H_2$ at a flowrate of 0.5 sccm was bubbled through it. Using these conditions, both p- and n-doped InP was grown around the mesa to form a p/n blocking structure about 4 μm thick. The p and n dopants respectively were introduced by the addition of dimethylzinc and tetraethyltin, respectively.

The sample was removed from the reactor, dipped into HF acid to remove the $SiO_2$, cleaned in a mixture of sulfuric acid, hydrogen peroxide, and water (10:1:1 by volume), and coated with an epitaxial layer of p-InP and p-InGaAs (2.5 μm thick and 0.7 μm thick, respectively) by hydride vapor phase epitaxy. The sample was then fabricated into lasers using standard processes described in Miller and Kaminow, supra.

EXAMPLE 2

A sample prepared as described in Example 1 except a p-substrate laser structure was wet chemical etched using a mixture of HBr, $H_2O_2$, and $H_2O$ to produce mesas for laser fabrication. The sample was loaded into a commercial (Thomas Swan) atmospheric pressure MOCVD reactor. An iron doped InP blocking layer was grown at 760 torr and 550° C. using a total flowrate of 5 SLPM and 180 sccm of $H_2$ containing 10% by volume $PH_3$. The carrier gas flow through the TMI was about 70 sccm and the bubbler temperature was 30° C. The flowrate of $H_2$ through the TCE bubbler was 1.8 sccm and the bubbler temperature was −10° C. After growth, the sample was removed and fabricated into lasers using standard techniques as described in Miller and Kaminow, supra.

I claim:

1. A process for fabricating a device comprising the steps of depositing a series of layers on a substrate wherein at least one of said layers comprises indium phosphide and wherein said indium phosphide layer is deposited by using a deposition gas comprising an indium-organic gas and a source of phosphorus characterized in that said deposition gas includes an organic composition other than said indium-organic gas that contains halogen.

2. The process of claim 1 wherein said device comprises a laser.

3. The process of claim 1 wherein said deposition of indium phosphide occurs on selective portions of said substrate.

4. The process of claim 1 wherein said indium-organic gas comprises an indium trialkyl.

5. The process of claim 4 wherein said composition containing halogen comprises trichloroethane.

6. The process of claim 1 wherein said composition containing halogen comprises chloroethane.

7. The process of claim 1 wherein said composition containing halogen comprises a material containing an atom chosen from the group consisting of chlorine, bromine, and iodine.

* * * * *